United States Patent [19]

Goronkin et al.

[11] Patent Number: 5,172,384
[45] Date of Patent: Dec. 15, 1992

[54] LOW THRESHOLD CURRENT LASER

[75] Inventors: Herbert Goronkin, Tempe; Michael S. Lebby, Chandler; Saied N. Tehrani, Scottsdale, all of Ariz.

[73] Assignee: Motorola, Inc., Schaumburg, Ill.

[21] Appl. No.: 695,062

[22] Filed: May 3, 1991

[51] Int. Cl.$^5$ ............................................. H01S 3/19
[52] U.S. Cl. ............................................. 372/45
[58] Field of Search ............................ 372/45, 44

[56] References Cited

U.S. PATENT DOCUMENTS 5,081,634  1/1992  Weisbuch et al. .................. 372/45

OTHER PUBLICATIONS

T. R. Chen et al., "Submilliamp Threshold In-GaAs-GaAs Strained Layer Quantum Well Laser" *IEEE Journal of Quantum Electronics*, vol. 26, No. 7, Jul. 1990, pp. 1183-1190.

R. M. Kolbas, "Laser Properties and Carrier Collection in Ultrathin Quantum-Well Heterostructures", IEEE Journal of Quantum Electronics, vol. 20, No. 1, Jan. 1990, pp. 25-31.

*Primary Examiner*—James W. Davie
*Attorney, Agent, or Firm*—Joe E. Barbee

[57] ABSTRACT

A thin layer, typically a monolayer, of a small band gap material (37) is inserted into the active layer (14) of a quantum well semiconductor device (36, 51). The band gap of the thin layer (37) is smaller than the band gap of the material in the active layer (14), thereby shifting carrier concentrations in the quantum well (26d, 26e, 26h, 26n) of the active layer (14) toward the thin layer (37). This shift increases alignment between the electron wave function (42, 54) and the hole wave function (44, 57) in the quantum well (26d, 26e, 26h, 26n) which increases the probability of stimulated photon emissions thereby reducing the threshold current and threshold voltage of the quantum well semiconductor device (36, 51).

19 Claims, 6 Drawing Sheets

LOW THRESHOLD CURRENT LASER

BACKGROUND OF THE INVENTION

The present invention relates, in general, to semiconductor devices, and more particularly, to a novel low threshold current, high efficiency semiconductor laser.

Semiconductor lasers had long been produced by the semiconductor industry. Of particular interest in recent years had been quantum well heterostructure lasers and especially strained layer quantum well heterostructure lasers. Strained layer structures referred to combining materials that have large differences in their lattice constant, that is, spacing of the atoms in the material's lattice structure. Indium arsenide and gallium arsenide represent an example of two materials that had large differences in their lattice constants. When such materials were combined to produce a semiconductor laser, the difference in the lattice constants developed strains or stress between the materials which limited the thickness of the materials. If the materials' thicknesses were not limited, the strain could cause misfit dislocations or cracks that resulted from the misfit of the two materials' lattice structures. Such cracks or misfit dislocations could result in failure of the semiconductor device. The potential of misfit dislocations limited not only the thickness of materials that had dissimilar lattice constants, but it also limited the ratio or mole fraction of materials that could be combined in a compound. Use of these materials in a heterostructure semiconductor resulted in limitations on carrier concentrations and location of the carriers due to the material's composition restrictions. Since the threshold current and the efficiency of a strained layer quantum well heterostructure laser were determined by carrier concentrations and placements in the laser's structure, the material composition limitations restricted the laser's threshold current and its efficiency. Even though the typical threshold current of such lasers was approximately one milliamp., it was larger than desired. Additionally, the value of the threshold voltage required to develop the threshold current was higher than desired.

Accordingly, it is desirable to have a strained layer quantum well laser that has a low threshold current (less than one milliamp.), that has a low threshold voltage, and that has a high efficiency.

SUMMARY OF THE INVENTION

Briefly stated, the present invention is achieved by inserting a thin layer, typically a monolayer, of a small band gap material into the active layer of a quantum well semiconductor device. The band gap of the thin layer is smaller than the band gap of the material in the active layer thereby increasing carrier concentrations in the active layer and shifting carrier concentration distributions in the quantum well of the active layer toward the thin layer. This shift increases alignment between an electron wave function and a hole wave function in the quantum well which increases the probability of stimulated photon emission thereby reducing the threshold current and threshold voltage of the quantum well semiconductor device.

DETAILED DESCRIPTION OF THE DRAWINGS

Figure 1:
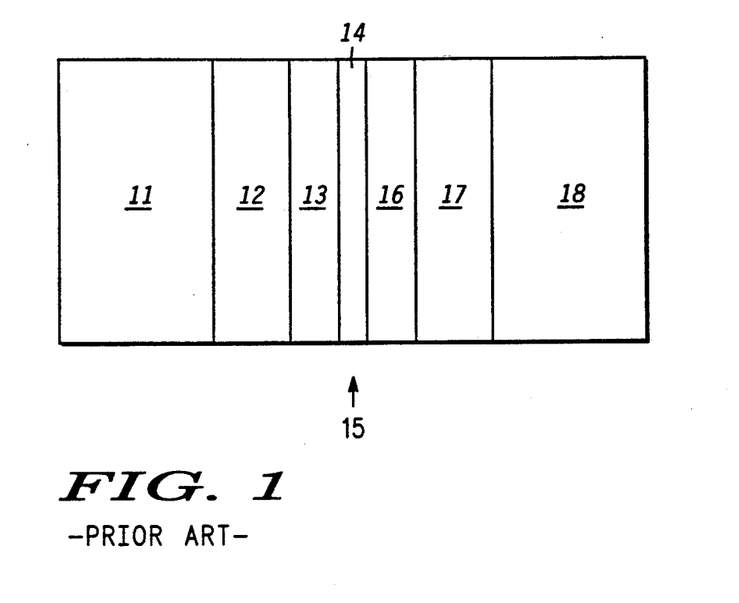
FIG. 1 is an enlarged cross section view of a portion of a prior art semiconductor laser.

Referring to FIG. 1, an enlarged cross section of a portion of a prior art strained layer quantum well laser 15 includes a cladding layer 11 and 18, an active layer 14, and guiding layers 12, 13, 16, and 17. Laser light is produced in active layer 14. Typically, the spatial distribution of light that is produced is too wide to be contained in active layer 14 and is spread from active layer 14 outward through guiding layers 13, 16, 12, and 17. In order to guide the photons toward active layer 14, guiding layers 12, 13, 16 and 17 have a refractive index that is lower than the refractive index of active layer 14. Generally, the ratios of materials used to form guiding layers 12, 13, 16, and 17 are varied in order to vary the refractive index from highest at the interface with layer 14 to lowest in cladding layers 11 and 18. A typical gallium arsenide strained layer quantum well laser such as laser 15, uses aluminum gallium arsenide for cladding layers 11 and 18, and also for guiding layers 12, 13, 16, and 17 while indium gallium arsenide is used for active layer 14. Combining indium with gallium in active layer 14 results in a strained layer that limits the amount of indium that can be used.

Figure 2:
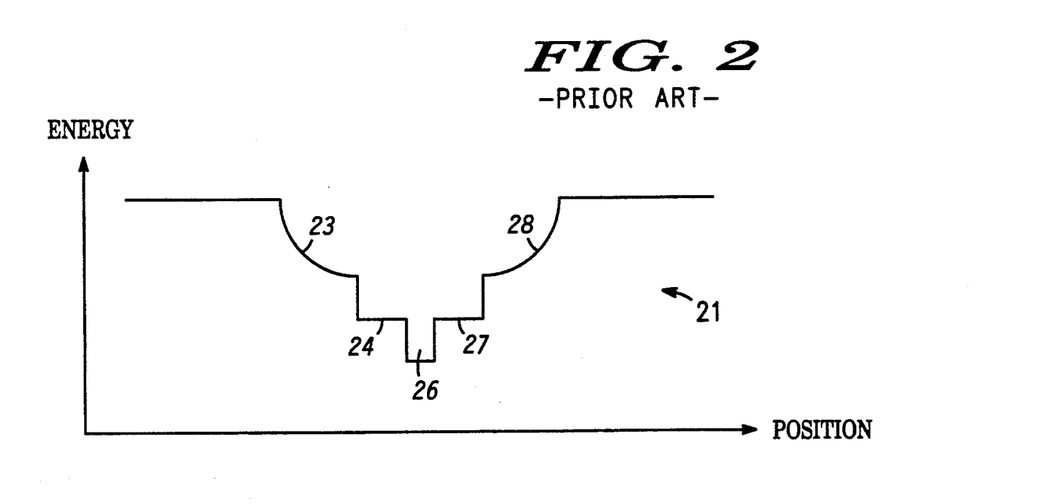
FIG. 2 is a prior art graph illustrating energy levels of the conduction band of the prior art semiconductor laser of FIG. 1.

Referring to FIG. 2, an energy diagram 21 is a graph illustrating the energy level of electrons in the conduction band of laser 15 (shown in FIG. 1). The abscissa indicates position within laser 15 while the ordinate indicates energy level. It is understood that as used herein the term "energy diagram", singular or plural, means a diagram that illustrates various levels of potential energy. For convenience, the following description of energy diagram 21 will refer to both FIG. 1 and FIG. 2. A quantum well 26 of energy diagram 21 corresponds to active layer 14 of laser 15 and has a thickness that is equal to the thickness of active layer 14. Quantum well 26 is a graphic illustration of the energy level of the material used in active layer 14. The concentrations of indium arsenide, and gallium arsenide in active layer 14 are formulated to provide a small band gap material that has a deep quantum well 26 yet a thickness that prevents generation of misfit dislocations in laser 15. It is desirable to have a high indium arsenide content in order to minimize the band gap of quantum well 26, yet the indium arsenide content must be limited to prevent misfit dislocations. One typical material ratio or mole fraction that satisfies these requirements would be indium 0.25, and gallium 0.75 to form $In_{0.25}Ga_{0.75}As$. The mole fraction concentration of aluminum arsenide, and gallium arsenide in guiding layers 12, 13, 16, and 17 are chosen to provide a lower refractive index than the refractive index in active layer 14. In the structure of laser 15, gallium arsenide, wherein the aluminum arsenide mole fraction is zero, was used for guiding layers 13 and 16, while aluminum gallium arsenide that has a varying aluminum and 20 gallium mole fraction was used for guiding layers 12 and 17. The aluminum mole fraction varies from 0.2 at the interface with guiding layer 13 and 16, to 0.5 at the interface with guiding layers 11 and 18. Therefore, the composition of guiding layers 12 and 17 is graded from $Al_{0.2}Ga_{0.8}As$ to $Al_{0.5}Ga_{0.5}As$. These material compositions determine the shape of energy diagram 21. An energy level 24 represents the lower energy level of gallium arsenide guiding layer 13 and an energy level 27 represents the lower energy level of GaAs guiding layer 16. Varying energy level 23 represents the graded aluminum arsenide and gallium arsenide mole fractions in graded guiding layer 12, while a similar energy level 28 represents the energy level of graded guiding layer 17.

The depth and thickness of quantum well 26 determines the energy level of each quantized state in quantum well 26 which then determines the number of carriers or carrier concentrations that can be confined in quantum well 26. Since quantum well 26 is deep, the quantized energy states are at low energy levels which results in increased carrier concentrations in quantum well 26. Since indium arsenide has a smaller band gap than gallium arsenide, use of high indium arsenide concentrations would provide quantum well 26 with increased depth, but, high indium arsenide concentrations would also result in generation of misfit dislocations. Therefore, the strained layer construction of active layer 14 limits the maximum carrier concentrations in quantum well 26. This limited carrier concentration, increases the threshold current of laser 15.

In order to form laser 15, cladding layer 11 is doped to form N-type semiconductor material while cladding layer 18 is doped to form P-type semiconductor material. The P-N doping provides a built-in bias that tilts the energy diagram of the conduction band as shown in FIG. 3.

Figure 3:
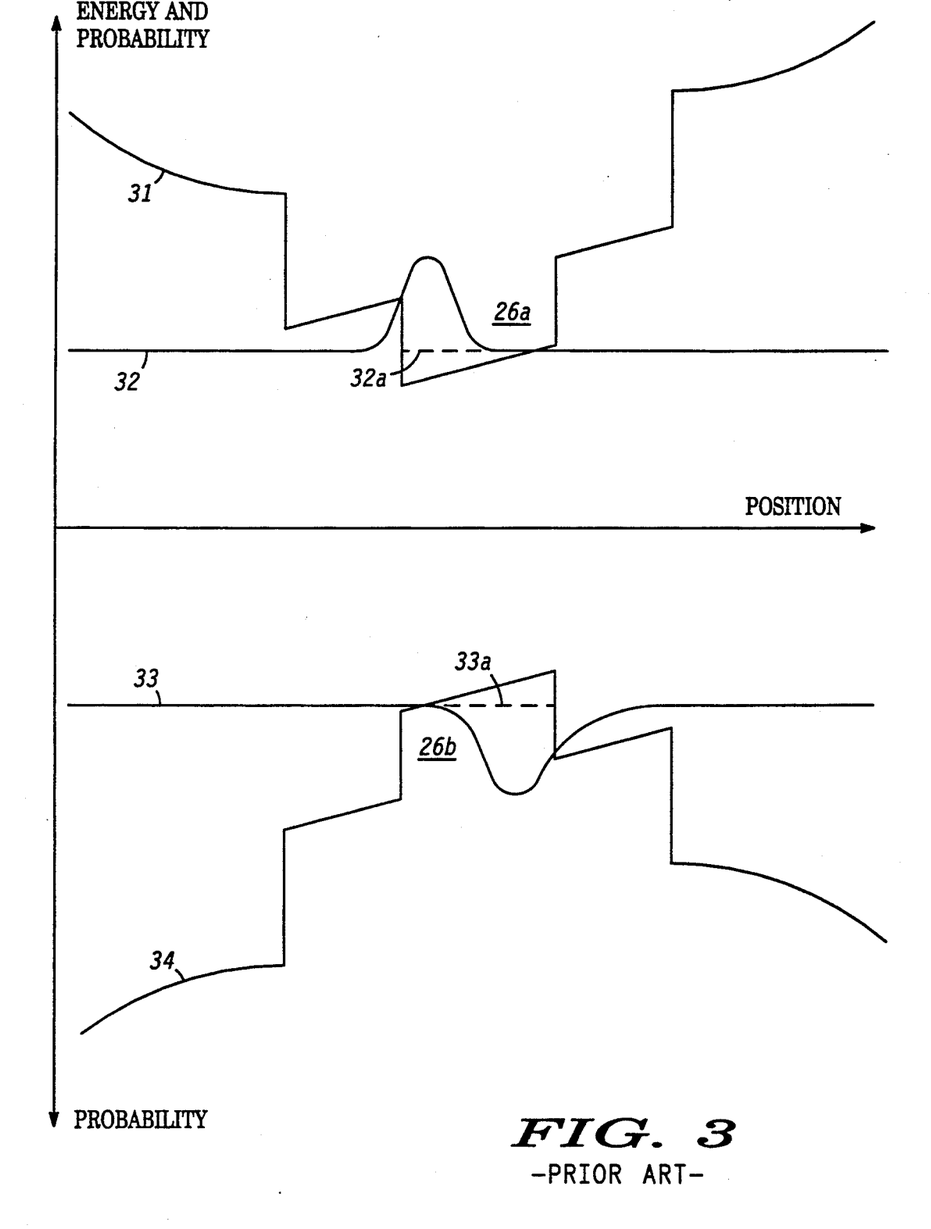
FIG. 3 is prior art graph illustrating electron and hole energies and probabilities in the prior art semiconductor laser of FIG. 1.

Referring to FIG. 3, a graph of an enlarged view of a prior art energy diagram illustrates an electron energy diagram 31 and a hole energy diagram 34. The abscissa indicates position within laser 15 (FIG. 1), while the ordinate indicates increasing energy and probability. Electron energy diagram 31 represents an expanded view of energy diagram 21 in FIG. 2 and includes the effect of the bias from the P-N doping. Hole energy diagram 34 is similar to electron energy diagram 31, but represents an energy diagram of holes in the valence band of laser 15 (shown in FIG. 1). Quantum well 26 of FIG. 2 is represented by an electron quantum well 26a and a hole quantum well 26b. An electron wave function 32, superimposed on electron energy diagram 31, illustrates the probability that an available electron energy state in the conduction band is occupied by an electron. Upward excursions of electron wave function 32 represent increased probabilities. Hole wave function 33 illustrates the probability that an available hole energy state in the valence band is occupied by a hole. Downward excursions of hole wave function 33 represent increased probabilities. Electron and hole wave functions 32 and 33 are superimposed on the lowest quantized energy state of each respective quantum well. The lowest quantized energy states are illustrated by dashed lines 32a and 33a. The built-in bias of the P-N doping provides an electric field that attracts electrons to the side of quantum well 26a that is toward the N-type doping and holes to the side of quantum well 26b toward the P-type doping. This shift of electrons and holes creates misalignment of the peaks of electron wave function 32 and hole wave function 33.

Figure 4:
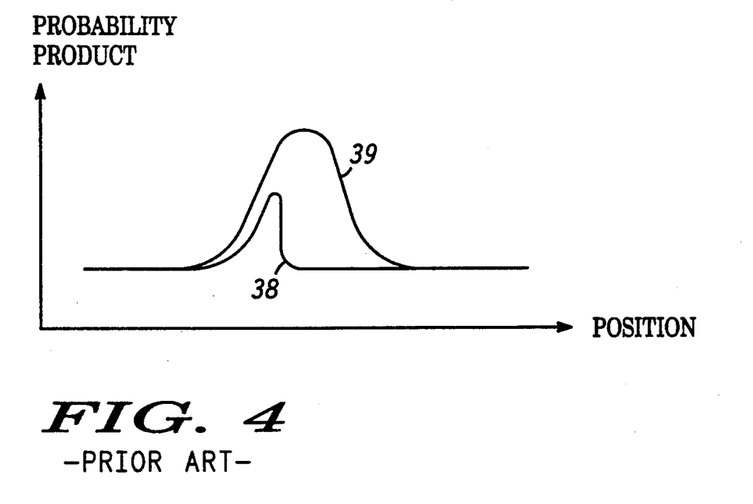
FIG. 4 is a prior art graph illustrating the product of the electron and hole probabilities of the graph of FIG. 3.

In order for photons or light to be produced, an electron must be stimulated to fall from the conduction band and recombine with a hole in the valence band. The integral of the product of electron wave function 32 times hole wave function 33 represents the density of electrons in quantum well 26a that can recombine with holes in quantum well 26b and produce photons or light. Since the peaks of electron wave function 32 and hole wave function 33 are not aligned, the product of the wave functions is small as shown by probability product 38 in FIG. 4. Product 38 can be compared to a theoretical maximum wave function probability product 39 to illustrate the low probability of electron-hole recombination.

A small voltage applied to laser 15 of FIG. 1 produces a current flow from P-type cladding layer 18 to N-type cladding layer 11. The small applied voltage tends to shift the wave functions and provide a small increase in alignment between electron wave function 32 and hole wave function 33 by raising the left hand side of energy diagrams 31 and 34. The increased alignment produced by the applied voltage stimulates more electrons to fall from a state in quantum well 26a and recombine with holes in quantum well 26b. This recombination produces a stimulated photon that travels through active layer 14 (see FIG. 1) and collides with the lattice structure of active layer 14 (see FIG. 1) creating an electron-hole pair. Since electron wave function 32 and hole wave function 33 still have minimal alignment, it is most probable that the created electron will recombine with a hole from quantum well 26b and produce recombination current. Consequently, this recombination current flow through laser 15 (of FIG. 1) does not produce emitted photons, but represents a leakage current or loss in laser 15 (FIG. 1). If sufficient voltage is applied to cause considerable alignment of electron and hole wave functions 32 and 33, an electron from quantum well 26a will be stimulated to recombine with a hole from quantum well 26b to produce a stimulated photon. The stimulated photon will travel through active layer 14 (see FIG. 1) and collide with the lattice structure creating an electron-hole pair. If there is sufficient alignment of electron and hole wave functions 32 and 33, the created electron will most probably recombine with a hole from quantum well 26b to create a photon, and the created hole will most probably recombine with an electron from quantum well 26a to produce another photon. Therefore the stimulated recombination of one electron-hole pair has generated two photons. These generated photons travel through active layer 14 to create two more electron hole pairs and four more photons, etc. The value of external current at the point that such stimulated emission occurs, is the threshold current. The value of externalvoltage that creates sufficient alignment of electron and hole wave functions 32 and 33 to produce stimulated emission, is the threshold voltage. Depending on the amount of alignment that has been produced by the external voltage, some of the electron-hole pairs will generate photons, and some will return to the conduction and valence bands as current and represent losses in laser 15 of FIG. 1.

Consequently, the requirement of preventing misfit dislocations and the requirement of grading the refractive index imposes a constraint on the depth and thickness of quantum wells 26a and 26b. These depth and thickness limitations limit carrier concentrations in quantum wells 26a and 26b as well as causing misalignment of electron wave function 32 and hole wave function 33. These constraints result in a laser 15 (see FIG. 1) that has high threshold current and high threshold voltage.

It has been found, that alignment of electron and hole wave functions can be improved by inserting a thin layer of a small band gap material into an active layer of a quantum well semiconductor device, and especially a strained layer quantum well heterostructure laser. The thin layer's thickness can vary from a molecular layer or monolayer to several monolayers, but must be less than the material's critical thickness. It is understood that a monolayer may have small portions with a thickness that exceeds one molecular layer and small portions that are voids, but these portions are small and the average thickness is substantially a molecular layer. For the purpose of the application, a monolayer is understood to include a layer having an average thickness that may be a fraction of a molecular thickness, that is, less than a single molecule. Inserting a layer as thin as a monolayer into an active layer dramatically effects the characteristics of a quantum well device. Such a thin layer of small band gap material increases the alignment of the electron and hole wave functions and increases the concentration of electrons and holes in the quantum well thereby decreasing the threshold current and the threshold voltage of a heterostructure laser. If the small band gap material is very thin, the probability of holes occupying a state and electrons occupying a state is increased in very close proximity to each other thereby increasing the probability that an electron will recombine with a hole and produce a photon.

The present invention provides a quantum well semiconductor device that has an alignment layer, a thin layer of a small band gap material, inserted into the active layer of the device to increase alignment of electron and hole wave functions. The alignment layer lowers the energy levels of the active layer which results in higher electron and hole concentrations in the vicinity of the alignment layer and improves confinement of the carriers in the vicinity of the alignment layer. The alignment layer is applied to a strained layer quantum well laser to provide high efficiency and low threshold current (less than one milliamp). While the invention is described with specific preferred embodiments, it is evident that many alternatives and variations will be apparent to those skilled in the semiconductor arts. More specifically the invention has been described for a particular strained layer quantum well laser structure that has a particular combination of semiconductor materials, although the method is directly applicable to other quantum well semiconductor devices, as well as to other semiconductor materials that could be used for the devices.

Figure 5:
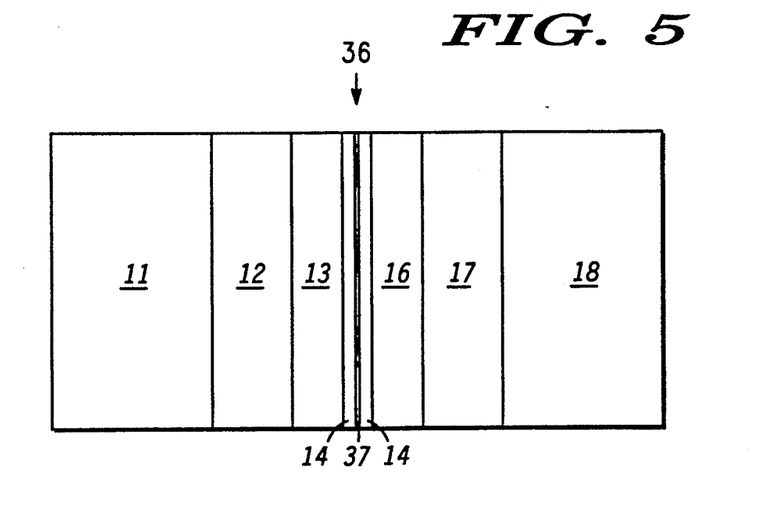
FIG. 5 is an enlarged cross section of a portion of a semiconductor laser in accordance with the present invention.

Referring to FIG. 5, an enlarged cross section of a portion of a strained layer quantum well heterostructure laser 36 includes cladding layers 11 and 18, and guiding layers 12, 13, 16, and 17 that are the same as the corresponding layers of laser 15 shown in FIG. 1. In laser 36, an alignment layer 37 is now positioned within active layer 14. Alignment layer 37 is a thin layer of a material that has a band gap that is small compared to the band gap of the material used for active layer 14. The small band gap of alignment layer 37 improves alignment between the electron and hole wave functions of laser 36 thereby lowering the threshold current and threshold voltage required to develop stimulated photon emission from laser 36. Typically, the thickness of alignment layer 37 is as thin as possible in order to improve the alignment of the electron and hole wave functions and form a peak in the electron and hole wave functions of active layer 14. The thickness of alignment layer 37 can be as small as a monolayer, a molecular layer, and still improve alignment between the electron and hole wave functions in active layer 14. On the other extreme, alignment layer 37 can be as thick as the critical thickness of the strained layer material, although such a wide alignment layer does not form exaggerated peaks as does a thinner layer it still improves the overlap of the electron and hole wave functions.

In the preferred embodiment, alignment layer 37 is an indium arsenide layer that is formed by the use of molecular beam epitaxy, or other methods known in the semiconductor art, to a thickness of approximately a monolayer (approximately 2-3 angstroms). Also in this embodiment, cladding layers 11 and 18 are an epitaxial layer of aluminum gallium arsenide that has a mole fraction composition of $Al_{0.5}Ga_{0.5}As$ and a thickness between approximately 1000 angstroms (Å) and 2000 Å. Guiding layers 12 and 17 each are an epitaxial aluminum gallium arsenide layer that has a graded mole fraction varying from $Al_{0.5}Ga_{0.5}As$ at the interface with cladding layers 11 and 18, to $Al_{0.2}Ga_{0.8}As$ at the interface with guiding layers 13 and 16. Guiding layers 12 and 17 each have a thickness between approximately 500 Å and 1000 Å. Guiding layers 13 and 16 are each an epitaxial layer of gallium arsenide (GaAs) that has a thickness between approximately 30 Å and 40 Å. Each portion of active layer 14 is a epitaxial layer of indium gallium arsenide that has a mole fraction of $In_{0.25}Ga_{0.75}As$ and a thickness of approximately 60 Å to 120 Å.

Figure 6:
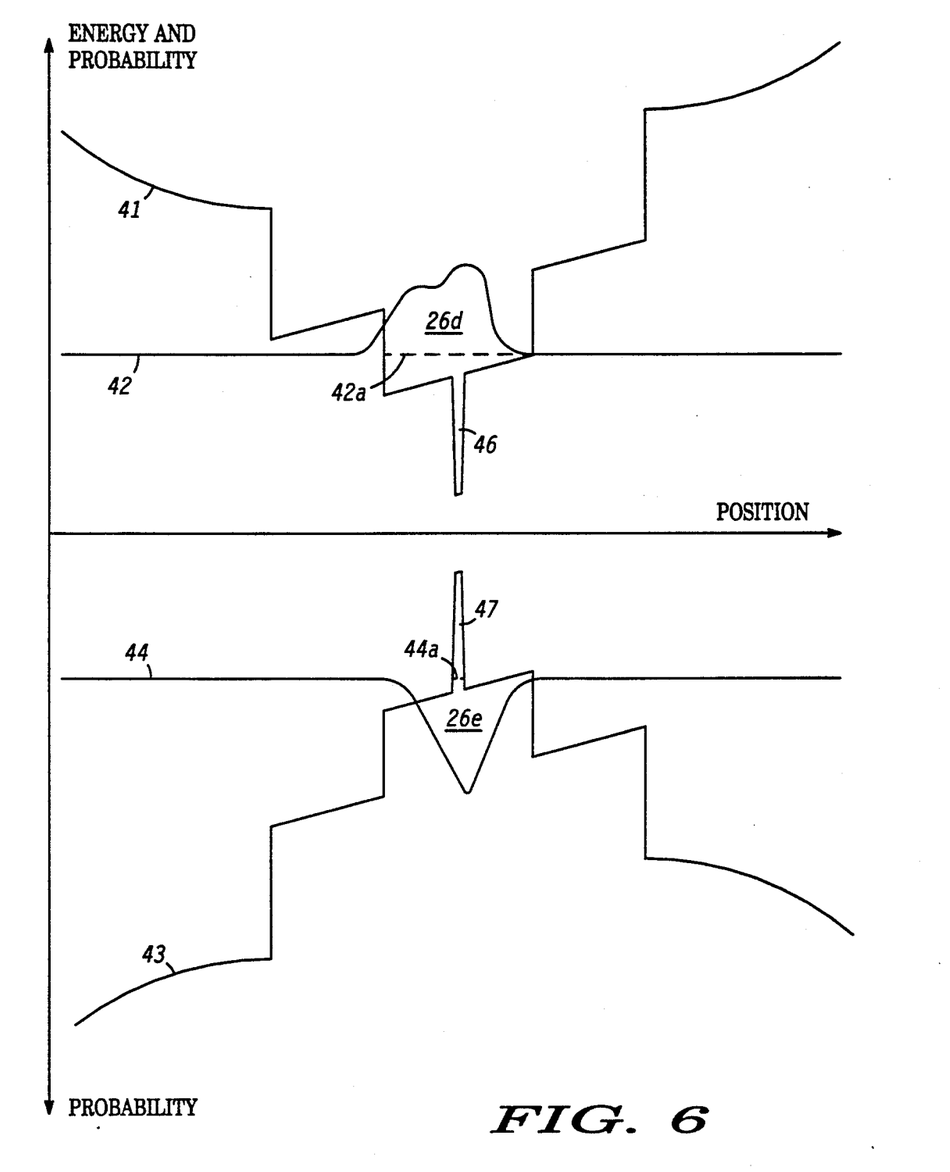
FIG. 6 is a graph illustrating electron and hole energies and probabilities in the semiconductor laser of FIG. 5 in accordance with the present invention.
Figure 7:
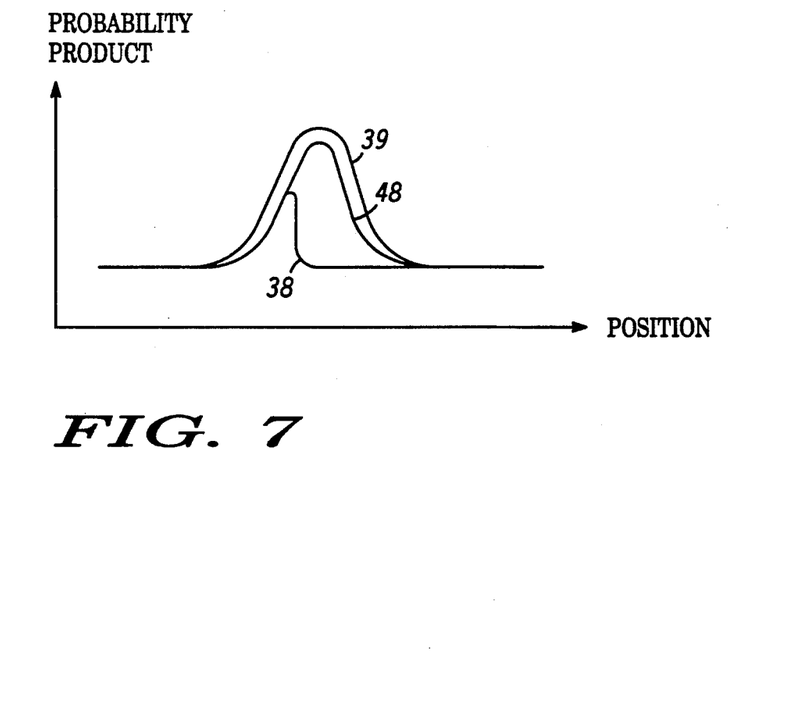
FIG. 7 is a graph illustrating the product of the electron and hole probabilities of the graph of FIG. 6 in accordance with the present invention.

Referring to FIG. 6, an enlarged graph of an energy diagram of laser 36 shown in FIG. 5 illustrates an electron energy diagram 41 for electrons in the conduction band and a hole energy diagram 43 for holes in the valence band. The abscissa indicates position within laser 36 of FIG. 5 and the ordinate indicates increasing energy and probability. An electron quantum well 26d and a hole quantum well 26e represent the quantum well created by active layer 14 of laser 36 (shown in FIG. 5). Quantum well 46, which represents the effect of alignment layer 37, divides quantum well 26d into two sections while quantum well 47 which has a similar effect on quantum well 26e, also represents the effect of alignment layer 37. The lowest quantized energy level for electrons and the highest quantized energy level for holes is represented by dashed lines 42a and 44a respectively. The effect of the small band gap of thin layer 37 is to lower the quantized energy levels in quantum wells 26d and 26e in order to increase the concentration of electrons and holes in quantum wells 26d and 26e, and also to improve the overlap of the electron and hole wave functions. The probability of these states being filled is very high since they have the lowest energy levels. The high probability of occupation for quantum well 46 increases the confinement of electrons in quantum well 26d and shifts the peak of electron wave function 42 toward quantum well 46, while quantum well 47 increases the confinement of holes in quantum well 26e and shifts the peak of hole wave function 44 toward quantum well 47. The increased carrier concentrations in the vicinity of quantum wells 46 and 47 create peaks in electron and hole wave functions 42 and 44 and improves alignment between the two wave functions thereby reducing the value of the threshold voltage that is required to align the wave functions and reducing the threshold current. Such peaking of the wave functions in a particular area is often referred to in the art as localization. The product of electron wave function 42 times hole wave function 44 is shown as graph 48 in FIG. 7. The increased wave function alignment is shown by comparing graph 48 to graph 38 from FIG. 4, which is repeated in FIG. 7 for convenience, and to theoretical maximum electron-hole wave function product graph 39. This increased wave function product means there is an increased probability of electron and hole recombination producing a photon which then produces another photon by stimulated emission as explained in FIG. 3. Consequently the number of electron hole pairs that are formed as leakage current is decreased and the number of stimulated photons is increased thereby decreasing the threshold voltage and current required to produce stimulated emission.

It should be noted in FIG. 6 that hole wave function 44 has a stronger alignment to quantum well 47 than electron wave function 42 does to quantum well 46. This is because holes have a larger mass therefore a stronger attraction to quantum well states than electrons. Since alignment layer 37 (FIG. 5) does not have an equal effect on both electron wave function 42 and hole wave function 44, the optimum placement of alignment layer 37 (FIG. 5) is toward the side of the device that is doped with carriers having the smaller effective mass electrons. In the case of laser 36 shown in FIG. 5, cladding layer 11 is N-type material, therefore alignment layer 37 should be positioned in active layer 14 towards the interface with guiding layer 13. Because of the unequal compensation provided by alignment layer 37 (of FIG. 5) there is a potential to further increase the alignment of electron and hole wave functions 42 and 44.

Figure 8:
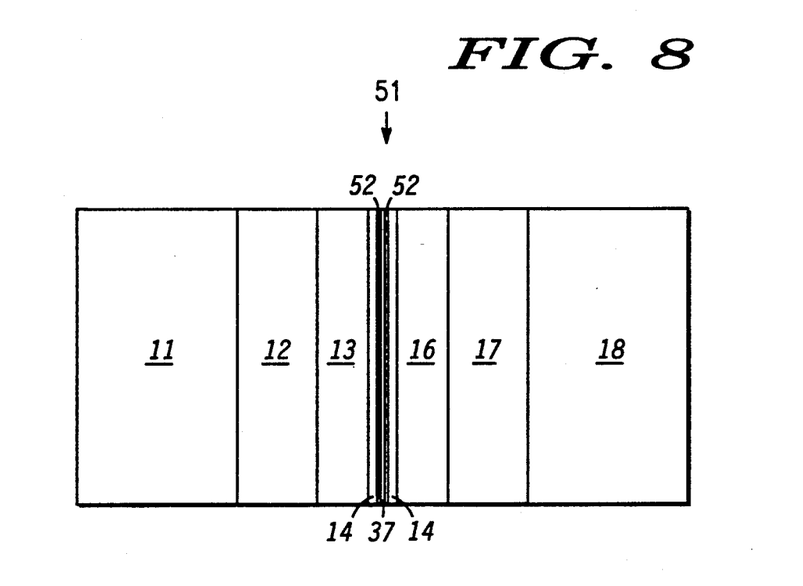
FIG. 8 is an enlarged cross section of a portion of a semiconductor laser in accordance with another embodiment of the present invention.

Referring to FIG. 8, it has been found that alignment of electron and hole wave functions can be further improved by positioning thin layers of a large band gap material adjacent to the thin layer of small band gap material used for an alignment layer such as alignment layer 37. An improvement in the alignment of the wave functions can be obtained even with the use of a single thin layer of large band gap material adjacent to the alignment layer. A strained layer quantum well laser 51 has cladding layers 11 and 18, active layer 14, alignment layer 37, and guiding layers 12, 13, 16, and 17 that are the same as those of laser 36 shown in FIG. 5. Laser 51 has two barrier layers 52 which are thin layers of a large band gap material that are positioned with one barrier layer 52 on either side of alignment layer 37. Barrier layers 52 may have thickness limitations that are the same as the limitations of alignment layer 37 described in FIG. 5. Barrier layers 52 are thin in order to prevent shifting of ground energy levels while causing the wave functions to be concentrated between the large band gap of barrier layers 52. This is illustrated in FIG. 9.

Figure 9:
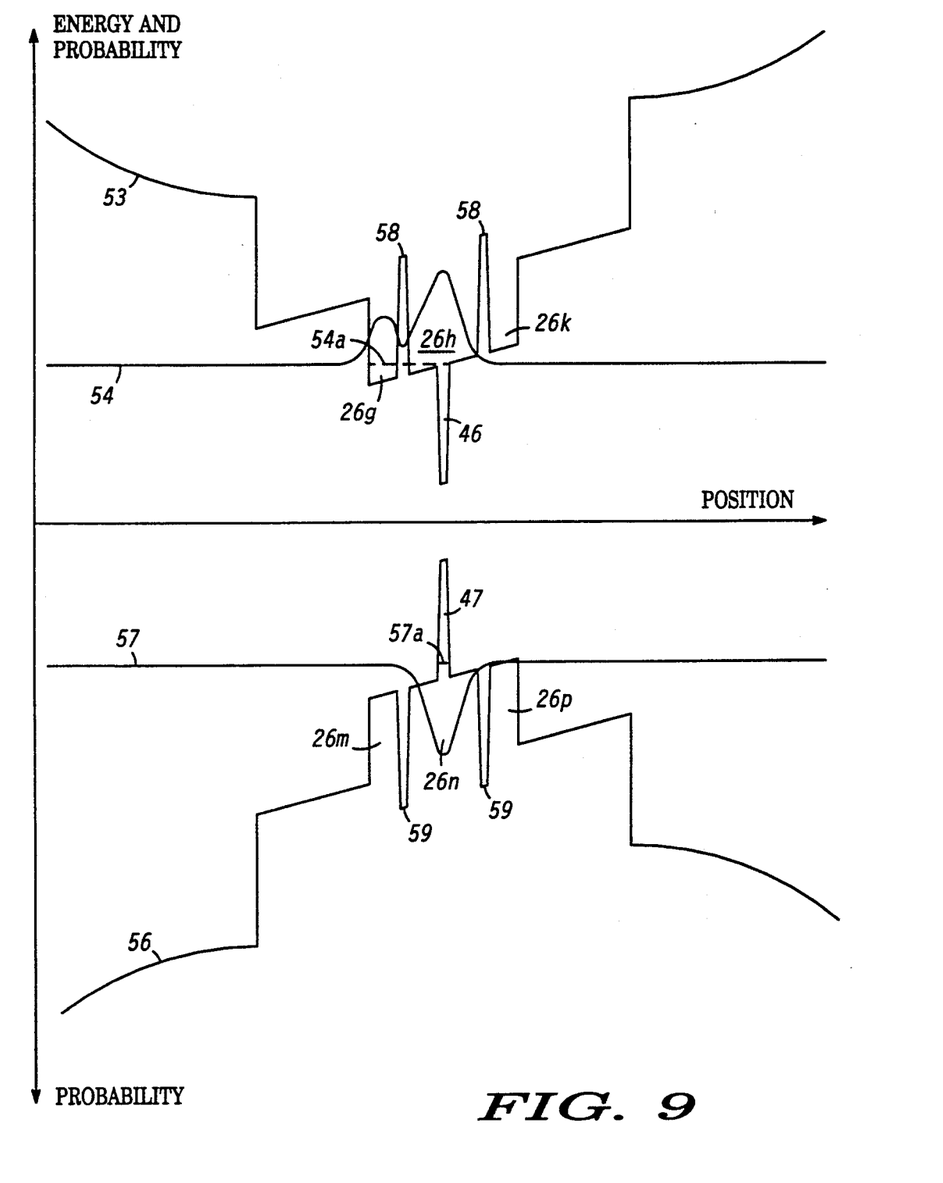
FIG. 9 is a graph illustrating electron and hole energies and probabilities in the semiconductor laser of FIG. 8 in accordance with the present invention.

Referring to FIG. 9, a graph of an enlarged energy diagram of laser 51 (shown in FIG. 8) illustrates an electron energy diagram 53 and a superimposed electron wave function 54 along with a hole energy diagram 56 and a superimposed hole wave function 57. The abscissa represents relative position in laser 51 of FIG. 8 while the ordinate represents increased energy and probability. Since it is convenient to refer to both FIG. 8 and FIG. 9 to explain the function of barrier layers 52, this section will contain references to both FIG. 8 and FIG. 9. Barrier layers 52 and alignment layer 37 provide electron energy diagram 53 that has a quantum well with sections 26g, 26h, and 26k. A barrier layer energy levels 58 represent the energy levels of barrier layers 2, while quantum well 46 is the same as quantum well 46 of FIG. 6. Similarly, hole energy diagram 56 has a quantum well having sections 26m, 26n, and 26p that are also formed by barrier layers 52 and alignment layer 37. A barrier layer energy levels 59 represent the hole energy levels created by barrier layers 52, while quantum well 47 is the same as quantum well 47 of FIG. 6. The lowest quantized energy level for electrons and the highest quantized energy level for holes is represented by dashed lines 54a and 57a respectively. By properly choosing the materials used for barrier layers 52, the electrons and holes can be shifted toward quantum well 26h and 26n thereby increasing the alignment of electron wave function 54 and hole wave function 57. In the preferred embodiment, each barrier layer 52 is a monolayer of aluminum arsenide (AlAs). Barrier layer energy levels 58 have a larger band gap than that of quantum well 26g, 26h, or 26k. The increased energy level of barrier levels 58 reduce electron concentrations in the vicinity of barrier layers 52, and shift those electrons toward the low energy level in the center of quantum well 26h. Consequently, barrier layers 52 increase the electron wave function in the vicinity of quantum well 46 as illustrated by the peak in electron wave function 54. Barrier layer energy levels 59 have a similar effect on hole energy diagram 56 and a hole wave function 57. The large band gap material of barrier layers 52 of FIG. 8 reduce hole concentrations in barrier layers 52, and shift these holes toward the center of quantum well 26n, thereby increasing the hole wave function in the vicinity of quantum well 47. Since hole wave function 57 had almost been peaked by alignment layer 37 in laser 36 of FIG. 5, the addition of barrier layers 52 had only a minimal effect on hole wave function 57. But, the addition of barrier layers 52 peaked electron wave function 54 and shifted it toward the peak of hole wave function 57 thereby increasing alignment between the wave functions, and lowering the threshold current of laser 51. Consequently, the addition of energy barrier layers 52 into a quantum well semiconductor device as illustrated in FIG. 8 reduces the threshold current and the threshold voltage of the quantum well device thereby improving the efficiency of the device.

It should be noted that a thin layer of a small band gap material can be inserted into the active layer of any quantum well semiconductor device to form an alignment layer that improves alignment between the electron and hole wave functions of the device. Although the material restrictions associated with a strained layer quantum well laser motivated the discovery of an alignment layer as described in FIG. 5 through FIG. 9, the use of an alignment layer is not limited to those laser structures or even to lasers, but is applicable to any quantum well heterostructure semiconductor device.

More specifically, an alignment layer is applicable to vertical cavity lasers, multiple quantum well lasers, stripe lasers, large optical cavity lasers, and other quantum well semiconductor devices. It should also be noted that the use of an alignment layer or combination of alignment layers with barrier layers can be used with various other materials such as an indium antimonide (InSb) alignment layer that is inserted into an indium gallium arsenide active layer which is positioned between two guiding layers of indium phosphide (InP).

By now it should be appreciated that there has been provided a novel way to lower the threshold current and threshold voltage of a semiconductor laser and improve its' efficiency. The technique of creating an alignment layer (or layers) by inserting a thin layer of a small band gap material in the active area of a quantum well semiconductor device to align the electron and hole wave functions of the device is useful to improve the efficiency of any quantum well semiconductor device. Further improvement is provided by positioning barrier layers adjacent to the alignment layer. An alignment layer can improve the efficiency of a variety of optical semiconductor devices including lasers, and light emitting diodes that are fabricated from a variety of semiconductor materials.

We claim:

1. A strained layer quantum well semiconductor laser that has low threshold current which comprises:
   a first guiding layer that is a III-V semiconductor material which has a refractive index sufficient for guiding photons produced by the laser wherein the first guiding layer has a first surface facing a portion of the laser that is doped N-type, and a second surface;
   an active layer on the second surface of the first guiding layer wherein the active layer is a III-V semiconductor material having a first band gap that forms a quantum well having a depth;
   a second guiding layer on the active layer wherein the second guiding layer is a III-V semiconductor material which has a refractive index sufficient for guiding photons produced by the laser and wherein a first surface of the second guiding layer faces a portion of the laser that is doped P-type; and
   an alignment layer positioned within the active layer and off-set toward the portion of the laser that is doped N-type for the purpose of improving alignment between a hole wave function of the laser and an electron wave function of the laser in order to reduce the threshold current of the laser.

2. The quantum well laser of claim 1 wherein the alignment layer has a thickness that is between a monolayer and a critical thickness.

3. The quantum well laser of claim 1 wherein the first guiding layer and the second guiding layer are both a gallium arsenide (GaAs) material.

4. The quantum well laser of claim 1 wherein the active layer is an indium gallium arsenide material.

5. The quantum well laser of claim 1 wherein the alignment layer is an indium arsenide (InAs) material.

6. The quantum well laser of claim 1 wherein the alignment layer includes an alignment layer comprising a small band gap material positioned between two layers of large band gap material in order to increase localization of the electron wave function and the hole wave function.

7. A method of reducing threshold current and improving efficiency of an optical semiconductor device which comprises:
   providing an optical semiconductor device having an active layer wherein light is produced within the active layer; and
   increasing alignment between an electron wave function of the optical semiconductor device and a hole wave function of the optical semiconductor device by positioning a thin layer of a small band gap semiconductor material within the active layer and toward a side of the optical semiconductor device that is doped with carriers having a small effective mass.

8. The method of claim 7 wherein positioning the thin layer of the small band gap semiconductor material includes positioning the thin layer of a semiconductor material that has a band gap that is smaller than a band gap of the active layer.

9. The method of claim 7 wherein positioning the thin layer of the small band gap semiconductor material within the active layer and toward the side of the optical semiconductor device that is doped with carriers having the small effective mass includes positioning the small band gap semiconductor material within the active layer and toward a side of the optical semiconductor device that is doped N-type.

10. The method of claim 7 wherein positioning the thin layer of the small band gap semiconductor material within the active layer includes positioning adjacent to the thin layer of the small band gap material thereby further increasing alignment between the electron wave function of the optical semiconductor device and the hole wave function of the optical semiconductor device.

11. The method of claim 7 wherein positioning the thin layer of the small band gap semiconductor material within the active layer includes positioning the thin layer between at least two thin layers of a large band gap semiconductor material thereby further increasing alignment between the electron wave function of the optical semiconductor device and the hole wave function of the optical semiconductor device.

12. The method of claim 10 wherein positioning the thin layer of small band gap material between at least two thin layers of the large band gap semiconductor material includes positioning the thin layer of small band gap material between at least two thin layers of a semiconductor material having a band gap that is larger that the small band gap of the thin layer and larger than a band gap of the active layer.

13. A method of improving localization in a quantum well semiconductor device which comprises:
   providing a quantum well semiconductor device having an active layer to provide a spatial distribution of light; and
   positioning an alignment layer within the active layer and toward a side of the quantum well semiconductor device that is doped N-type for the purpose of substantially aligning a peak of an electron wave function with a peak of a hole wave function.

14. The method of claim 13 wherein positioning the alignment layer within the active layer includes positioning within the active layer a thin layer of a small band gap semiconductor material having a thickness that is at least a monolayer and less that a critical thickness.

15. The method of claim 13 wherein positioning the alignment layer within the active layer includes positioning within the active layer a thin layer of a semiconductor material having a band gap that is smaller than a band gap of the active layer.

16. The method of claim 13 wherein positioning the alignment layer within the active layer includes forming the alignment layer by positioning a thin layer of a small band gap semiconductor material between two thin layers of a large band gap semiconductor material.

17. A quantum well semiconductor device with high localization comprising:
an active layer that has a first band gap which forms a quantum well wherein light is produced within the active layer; and
an alignment layer positioned within the active layer and off-set toward a portion of the quantum well semiconductor device that is doped with carriers having a small effective mass wherein the alignment layer increases alignment of an electron wave function and a hole wave function within the quantum well.

18. The quantum well semiconductor device of claim 17 wherein the alignment layer has a thickness that is approximately equal to a monolayer, and has a second band gap that is smaller than the first band gap.

19. The quantum well semiconductor device of claim 17 wherein the alignment layer includes a thin layer of a semiconductor material having a second band gap that is smaller than the first band gap wherein the thin layer is positioned between two layers of material that each have a third band gap that is larger than the first band gap.

* * * * *

UNITED STATES PATENT AND TRADEMARK OFFICE
CERTIFICATE OF CORRECTION

PATENT NO. : 5,172,384
DATED : December 15, 1992
INVENTOR(S) : Herbert Goronkin et al.

It is certified that error appears in the above-indentified patent and that said Letters Patent is hereby corrected as shown below:

Column 10, claim 10, line 31, after "positioning", insert --a thin layer of a large band gap semiconductor material--.

Column 10, claim 12, line 51, change "that" to --than--.

Column 10, claim 14, line 67, change "that", second occurrence, to --than--.

Signed and Sealed this

Twenty-eighth Day of June, 1994

Attest:

BRUCE LEHMAN

Attesting Officer

Commissioner of Patents and Trademarks